United States Patent
Kang et al.

[11] Patent Number: 6,031,753
[45] Date of Patent: Feb. 29, 2000

[54] NONVOLATILE FERROELECTRIC MEMORY AND CIRCUIT FOR CONTROLLING THE SAME

[75] Inventors: Hee Bok Kang, Taejeon-si; Doo Young Yang, Chungcheongbuk-do, both of Rep. of Korea

[73] Assignee: LG Semicon Co., Ltd., Cheongju, Rep. of Korea

[21] Appl. No.: 09/150,173

[22] Filed: Sep. 9, 1998

[30] Foreign Application Priority Data

Apr. 3, 1998 [KR] Rep. of Korea .................. 98-11798

[51] Int. Cl.[7] .................................................. G11C 11/24
[52] U.S. Cl. .......................... 365/145; 365/154; 365/205; 365/149
[58] Field of Search ................................ 365/145, 149, 365/154, 205, 207, 208

[56] References Cited

U.S. PATENT DOCUMENTS

| | | | |
|---|---|---|---|
| 4,433,390 | 2/1984 | Carp et al. | 364/900 |
| 4,873,664 | 10/1989 | Eaton, Jr. | 365/145 |
| 4,888,630 | 12/1989 | Paterson | 357/23.5 |
| 4,888,733 | 12/1989 | Mobley | 365/145 |
| 4,928,095 | 5/1990 | Kawahara | 340/784 |
| 5,010,518 | 4/1991 | Toda | 365/145 |
| 5,361,224 | 11/1994 | Takasu | 365/145 |
| 5,371,699 | 12/1994 | Larson | 365/145 |
| 5,390,143 | 2/1995 | Manning | 365/145 |
| 5,628,318 | 5/1997 | Seyyedy | 365/145 |
| 5,680,344 | 10/1997 | Seyyedy | 365/145 |
| 5,726,930 | 3/1998 | Hasegawa et al. | 365/145 |
| 5,751,627 | 5/1998 | Ooishi | 365/145 |
| 5,859,794 | 1/1999 | Chan | 365/149 |
| 5,910,911 | 6/1999 | Sekiguchi et al. | 365/145 |

*Primary Examiner*—David Nelms
*Assistant Examiner*—Gene N. Auduong
*Attorney, Agent, or Firm*—Fleshner & Kim

[57] ABSTRACT

Nonvolatile ferroelectric memory, is disclosed, which has a simple circuit and a fast access time and allows a nondestructive read mode; and a circuit for controlling the same, the memory including a wordline for applying a driving signal, a bitline and a bitbarlines for applying data signals, a ferroelectric capacitor for storing the data, a first, and a second switching devices for switching between opposite terminals on the ferroelectric capacitor and the bitline and the bitbarline respectively in response to a control signal from the wordline, and an amplifier for amplifying voltages from the opposite terminals on the ferroelectric capacitor.

22 Claims, 7 Drawing Sheets

FIG.6
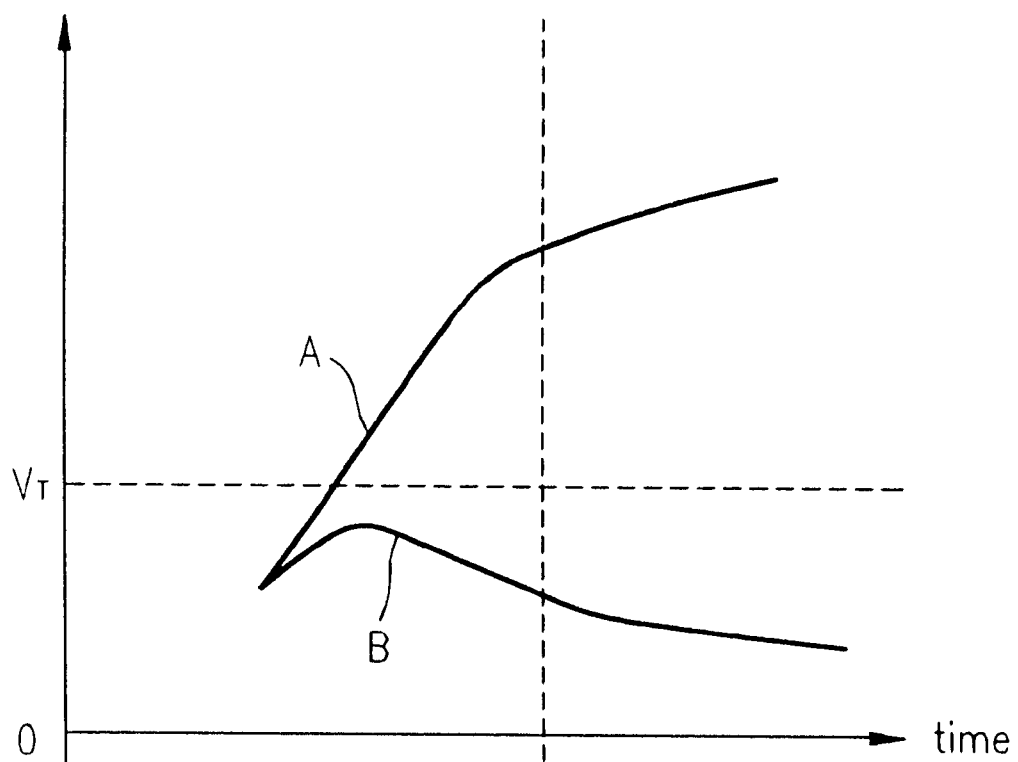
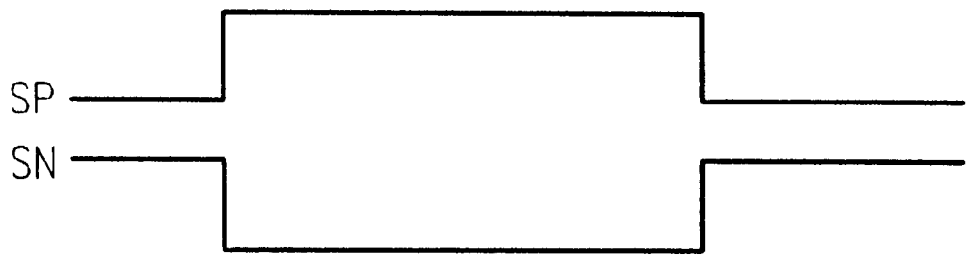

NONVOLATILE FERROELECTRIC MEMORY AND CIRCUIT FOR CONTROLLING THE SAME

BACKGROUND OF THE INVENTION

1. Field of the Invention

The present invention relates to a ferroelectric memory, and more particularly, to a nonvolatile ferroelectric memory which has a simple circuit and a fast access time and allows a non-destructive read mode; and a circuit for controlling the same.

2. Discussion of the Related Art

In general, in writing a data on the nonvolatile ferroelectric memory, voltages of opposite polarities should be applied to a bitline and a bitbarline, which are opposite terminals of a ferroelectric capacitor in the nonvolatile ferruelectric memory, and in reading the data stored in the nonvolatile ferroelectric memory, specific voltages should be applied to opposite terminals of the ferroelectric capacitor, for detecting inversion of a polarity of the ferroelectric capacitor. In this instance, since the stored data is erased, the data should be written in the ferroelectric capacitor, again.

The aforementioned nonvolatile ferroelectric memory will be explained with reference to the attached drawings. FIG. I illustrates a circuit of a background art nonvolatile ferroelectric memory, FIGS. 2a and 2b illustrate schematically explain data storages in a background art ferroelectric memory, and FIG. 3 illustrates a hystereris loop showing voltage vs. polarity.

Referring to FIG. 1, the background art nonvolatile ferroelectric memory is provided with a wordline W/L, a bitline BIT and a bitbarline BITB, a ferroelectric capacitor 1 for storing a data, a first transistor 2 for switching between one side of two sides of the ferroelectric capacitor 1 and the bitline BIT in response to a control signal from the wordline W/L, and a second transistor 3 for switching between the other side of the ferroelectric capacitor 1 and the bitbarline BITB in response to a control signal from the wordline W/L. The first, and second transistors 2 and 3 have source and drain electrodes respectively connected to the bitline(or bitbarline) and the capacitor 1 and gate electrodes connected to the wordlines W/L.

The operation of the background art nonvolatile ferroelectric memory will be explained.

First, data writing will be explained. Upon application of a "high" signal to the wordline W/L on a cell selected to write a data, the first and second transistors 2 and 3 are turned on. And, when voltages of opposite polarities are applied to the bitline BIT and the bitbarline BITB, opposite terminals of the ferroelectric capacitor 1, a ferroelectric material becomes to have a particular polarity. Having a particular polarity thus is having the data written. That is, as shown in FIGS. 2a and 2b, a ferroelectric film 25 between two electrodes 24 and 26 forms the capacitor. As shown in FIG. 2a, when the first electrode BIT 24 is applied of a 5V and the second electrode BITB 26 is applied of 0V, the first electrode 24 has a positive polarity and the second electrode has a negative polarity. And, the ferroelectric film 25 has polarities opposite to the first, and second electrodes 24 and 26 at surfaces facing the first, and second electrodes 24 and 26. Opposite to this, as shown in FIG. 2b, when the first electrode BIT 24 is applied of a 0V and the second electrode BITB 26 is applied of 5V, the first electrode 24 has a negative polarity and the second electrode has a positive polarity. And, the ferroelectric film 25 has polarities opposite to the first, and second electrodes 24 and 26 at surfaces facing the first, and second electrodes 24 and 26. The polarities of the ferroelectric film 26 are remained even after the voltages are cut off, storing a data.

Next, data reading will be explained. Upon application of particular voltages to the opposite terminals of the ferroelectric capacitor 1 for reading the data stored therein, polarities of the capacitor 1 may or may not be inverted. As the polarities memorized in the capacitor 1 can be detected by detecting current caused to flow when the polarities are inverted on application of the particular voltages thus, the data can be read. That is, upon application of 5V to the first electrode 24 and 0V to the second electrode 26 when the ferroelectric film 25 has polarities as shown in FIG. 2a, as can be known from the hysteresis loop shown in FIG. 3, a polarity difference of $\Delta P1$ is occurred. And, upon application of 0V to the first electrode 24 and 5V to the second electrode 26 when the ferroelectric film 25 has polarities as shown in FIG. 2a, as can be known from the hysteresis loop shown in FIG. 3, a polarity difference of $\Delta P2$ is occurred, with polarities of the ferroelectric film as shown in FIG. 2b. Thus, the data is read. However, as the polarities of the ferroelectric film 25 is inverted for reading the data, the data should be re-written thereon so that the capacitor 1 to have original polarities after the reading.

However, the aforementioned background art nonvolatile ferroelectric memory has the following problems.

First, as the capacitor is operative in a destructive mode in reading a data stored in the ferroelectric capacitor, the background art nonvolatile ferroelectric memory is vulnerable to a ferroelectric material fatigue.

Second, since an original data should be re-written without fail after reading the data stored in the capacitor, control becomes complicated and an access time is delayed.

SUMMARY OF THE INVENTION

Accordingly, the present invention is directed a nonvolatile ferroelectric memory that substantially obviates one or more of the problems due to limitations and disadvantages of the related art.

An object of the present invention is to provide a nonvolatile ferroelectric memory which has a fast access time and can read a data in a non-destructive mode which can prevent fatigue of the ferroelectric film.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the nonvolatile ferroelectric memory includes a wordline for applying a driving signal, a bitline and a bitbarlines for applying data signals, a ferroelectric capacitor for storing the data, a first, and a second switching devices for switching between opposite terminals on the ferroelectric capacitor and the bitline and the bitbarline respectively in response to a control signal from the wordline, and an amplifier for amplifying voltages from the opposite terminals on the ferroelectric capacitor.

In other aspect of the present invention, there is provided a circuit for controlling a nonvolatile ferroelectric memory, including a ferroelectric memory having a bitline, a bitbarline and a wordline, a first switching part for supplying a static voltage to the bitline and the bitbarline in response to an external signal, an equalizing part for equalizing the bitline and the bitbarline to a ground voltage in response to an external signal, a second switching part for applying a data signal to the bitline and the bitbarline in writing in response to external signals, and an amplifying part for amplifying signals on the bitline and the bitbarline and feeding back to the bitline and the bitbarline for sensing of the sense amplifier.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIG. 6 illustrates a graph showing a voltage difference at opposite terminals of a ferroelectric capacitor provided for explaining the controlling circuit of the present invention; and, FIG. 7 illustrates a timing diagram in a read mode of the nonvolatile ferroelectric memory of the present invention.

DETAILED DESCRIPTION OF THE PREFERRED EMBODIMENT

Figure 4:
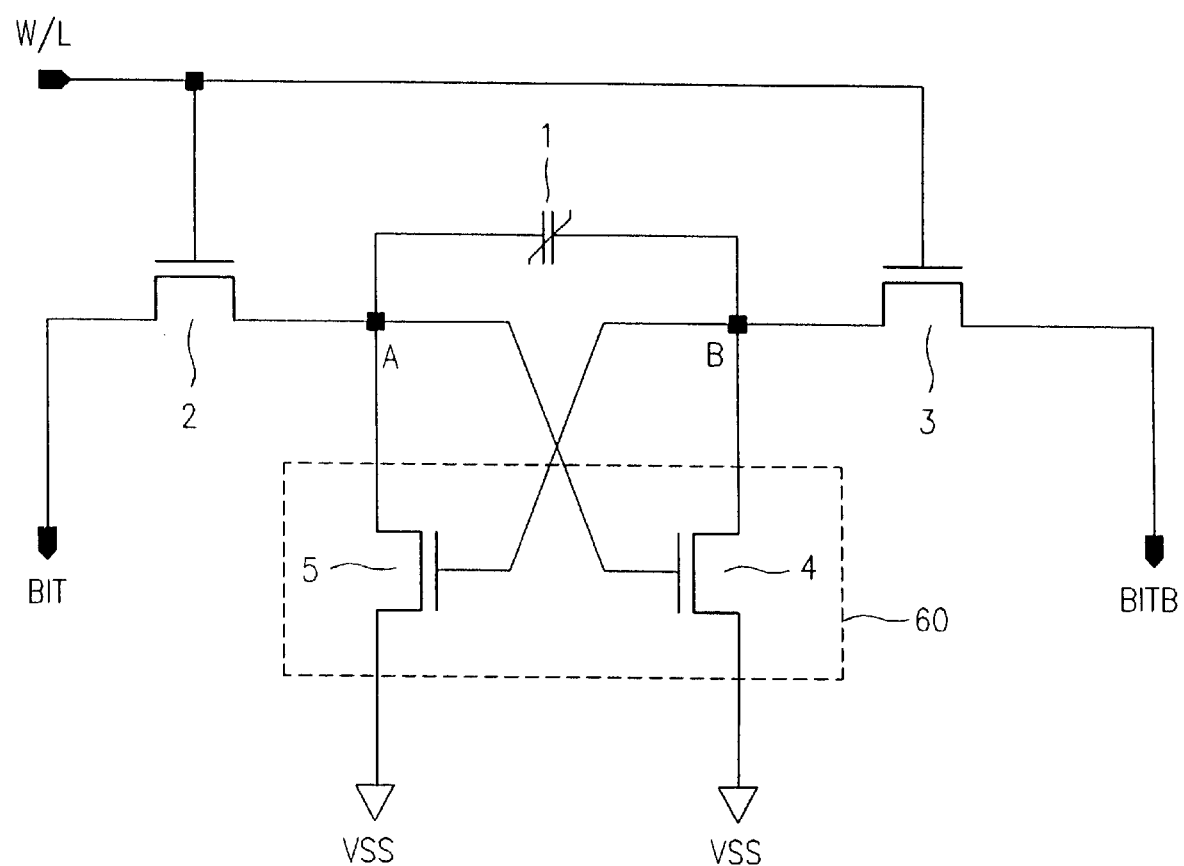
FIG. 4 illustrates a circuit of a nonvolatile ferroelectric memory in accordance with a preferred embodiment of the present invention.
Figure 7:
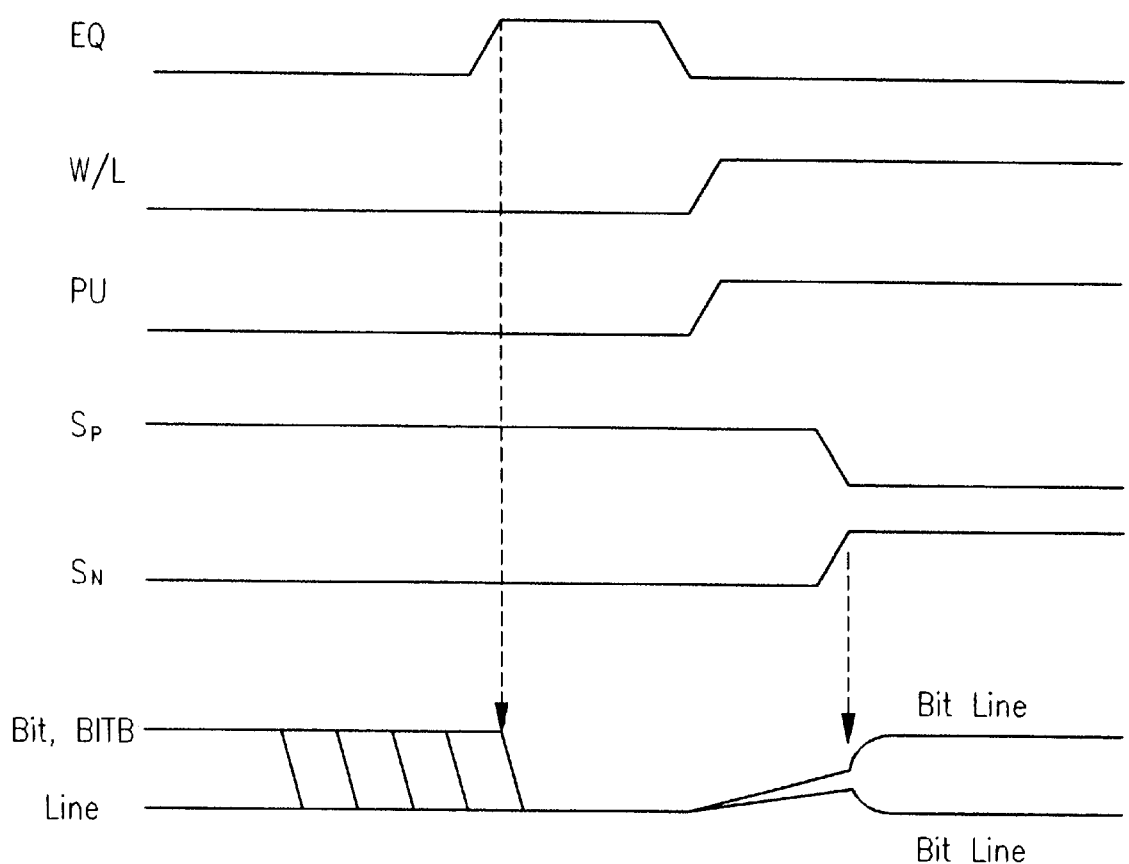

Reference will now be made in detail to the preferred embodiments of the present invention, examples of which are illustrated in the accompanying drawings. FIG. 4 illustrates a circuit of a nonvolatile ferroelectric memory in accordance with a preferred embodiment of the present invention, FIG. 5 illustrates a circuit for controlling the nonvolatile ferroelectric memory of the present invention, FIG. 6 illustrates a graph showing a voltage difference at opposite terminals of a ferroelectric capacitor provided for explaining the controlling circuit of the present invention, and FIG. 7 illustrates a timing diagram in a read mode of the nonvolatile ferroelectric memory of the present invention.

Referring to FIG. 4, the nonvolatile ferroelectric memory in accordance with a preferred embodiment of the present invention has four transistors and one ferroelectric capacitor. That is, the nonvolatile ferroelectric memory includes a wordline W/L for applying a driving signal, a bitline BIT and a bitbarlines BITB for applying data signals, a ferroelectric capacitor 1 for storing the data, a first transistor 2 for switching between a first electrode of opposite electrodes on the ferroelectric capacitor 1 and the bitline BIT in response to a control signal from the wordline W/L, a second transistor 3 for switching between a second electrode of the ferroelectric capacitor 1 and the bitbarline BITB in response to a control signal from the wordline W/L, and an amplifier 60 for amplifying voltages from the opposite terminals on the ferroelectric capacitor 1. The amplifier 60 includes a third transistor 4 having a gate electrode connected to a contact point A of the first transistor 2 and a capacitor first electrode for switching a contact point B of the second transistor 3 and a capacitor second electrode and a ground terminal, and a fourth transistor 5 having a gate electrode connected to a contact point B of the second transistor 3 and the capacitor second electrode for switching the contact point A of the first transistor 2 and the capacitor first electrode and a ground terminal. The first, and second transistors 2 and 3 have source and drain electrodes connected to the bitline(or bitbarline) and the capacitor 1 respectively, and gates electrodes connected to the wordline W/L.

Figure 5:
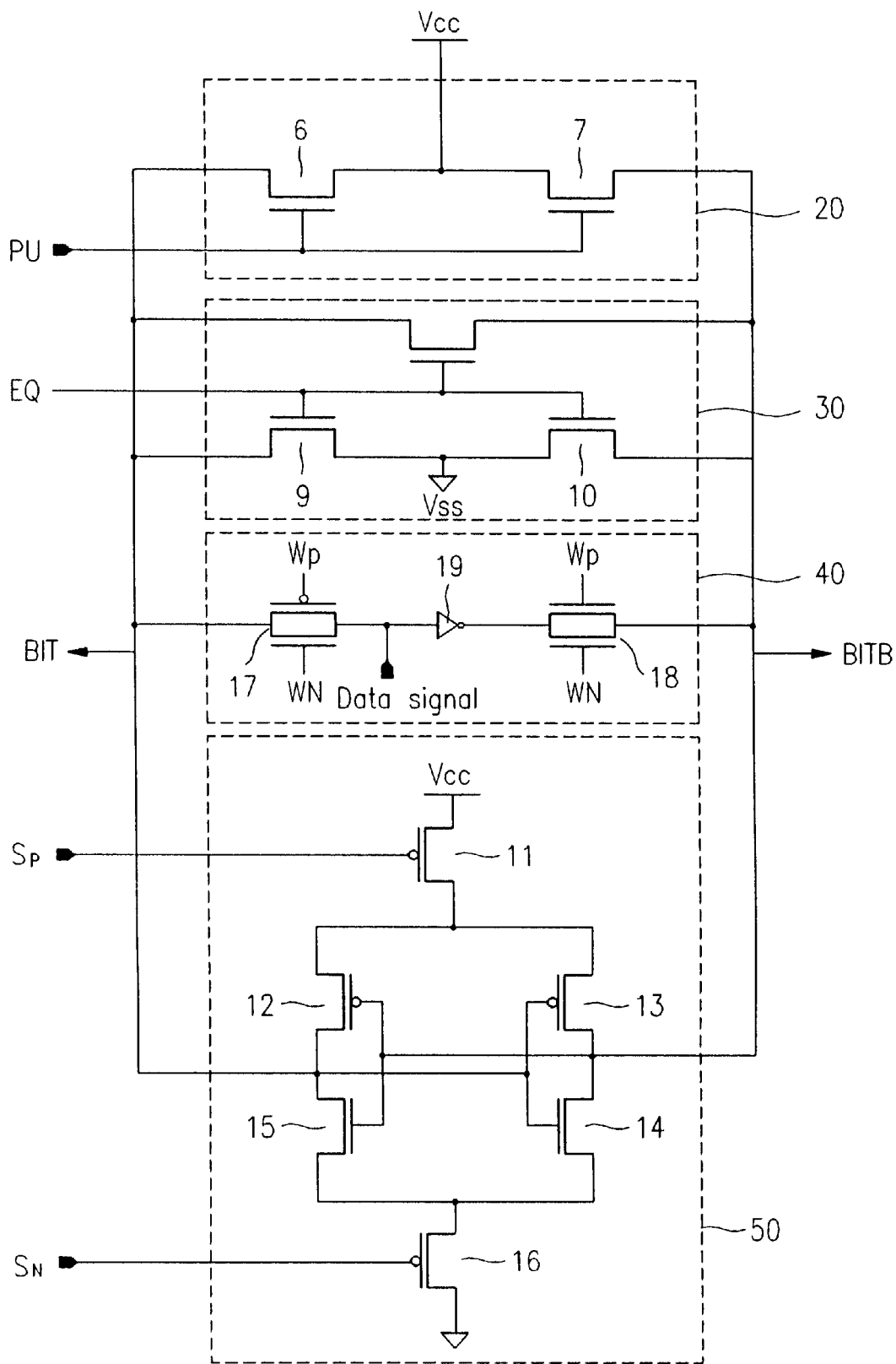
FIG. 5 illustrates a circuit for controlling the nonvolatile ferroelectric memory of the present invention.

A circuit for controlling the aforementioned nonvolatile ferroelectric memory of the present invention is shown in FIG. 5.

Referring to FIG. 5, the circuit includes a first switching part 20 having a plurality of transistors 6 and 7 for supplying a static voltage Vcc to the bitline BIT and the bitbarline BITB in response to an external signal PU, an equalizing part 30 having a plurality of transistors 8, 9 and 10 for equalizing the bitline BIT and the bitbarline BITB to a ground voltage Vss in response to an external signal EQ, a second switching part 40 having a plurality of transmission gates 17 and 18 and inverters 19 for applying a data signal to the bitline BIT and the bitbarline BITB in writing in response to external signals WP and WN, and an amplifying part 50 having a plurality of transistors 11–16 for amplifying signals on the bitline BIT and the bitbarline BITB and feeding back to the bitline BIT and the bitbarline BITB for sensing of the sense amplifier.

The operation of the nonvolatile ferroelectric memory of the present invention and a circuit for controlling the same will be explained.

WRITE MODE

Figure 1:
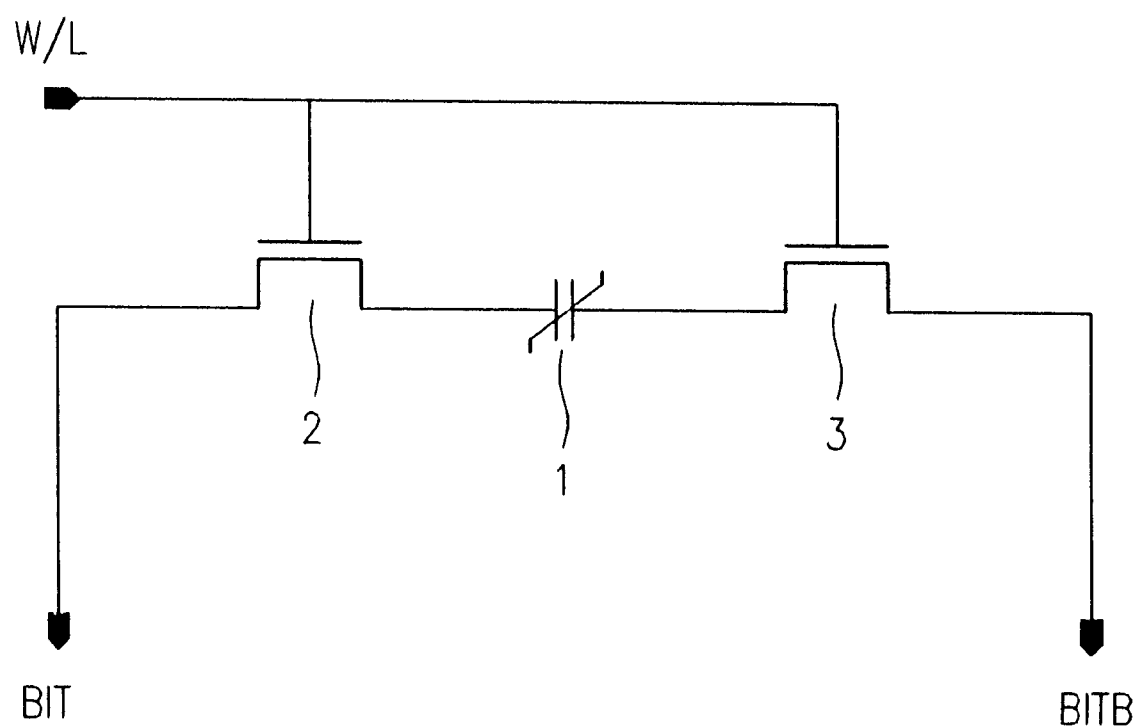
FIG. 1 illustrates a circuit of a background art nonvolatile ferroelectric memory.
Figure 2A:
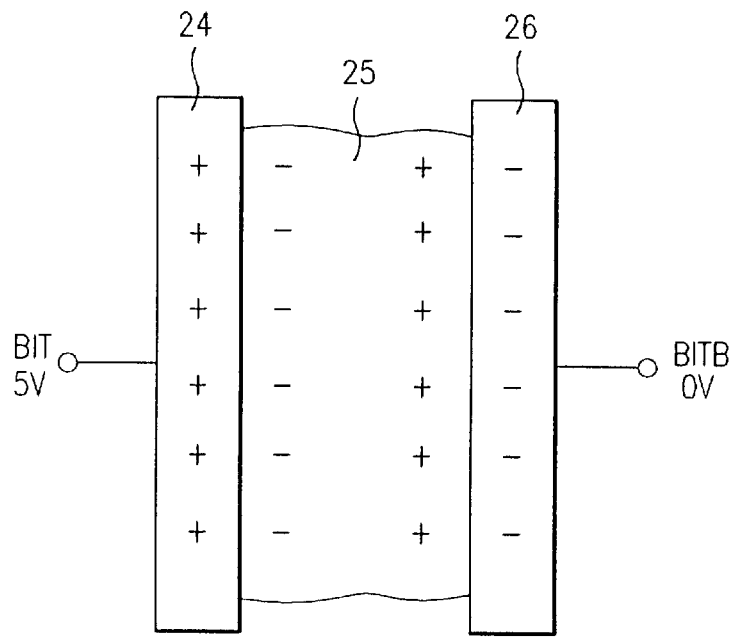
FIGS. 2a and 2b illustrate schematically explain data storages in a background art ferroelectric memory.
Figure 2B:
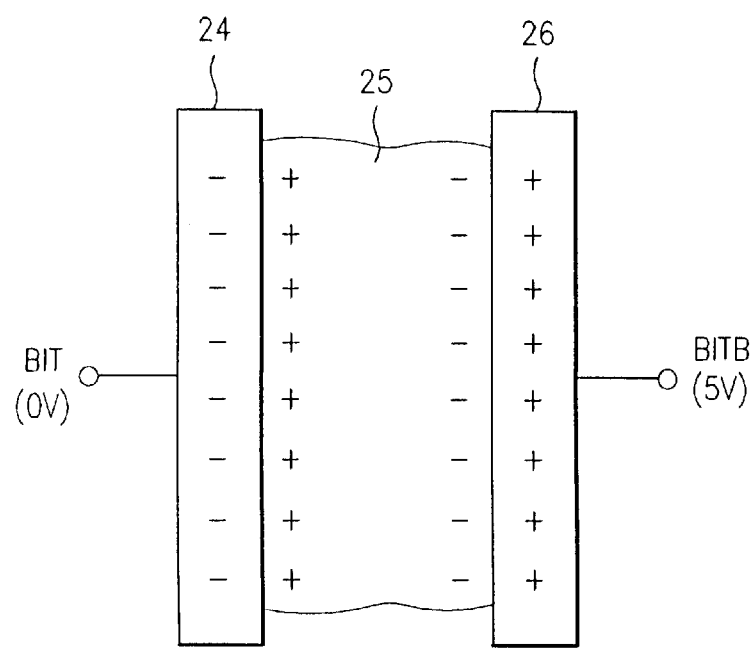
Figure 3:
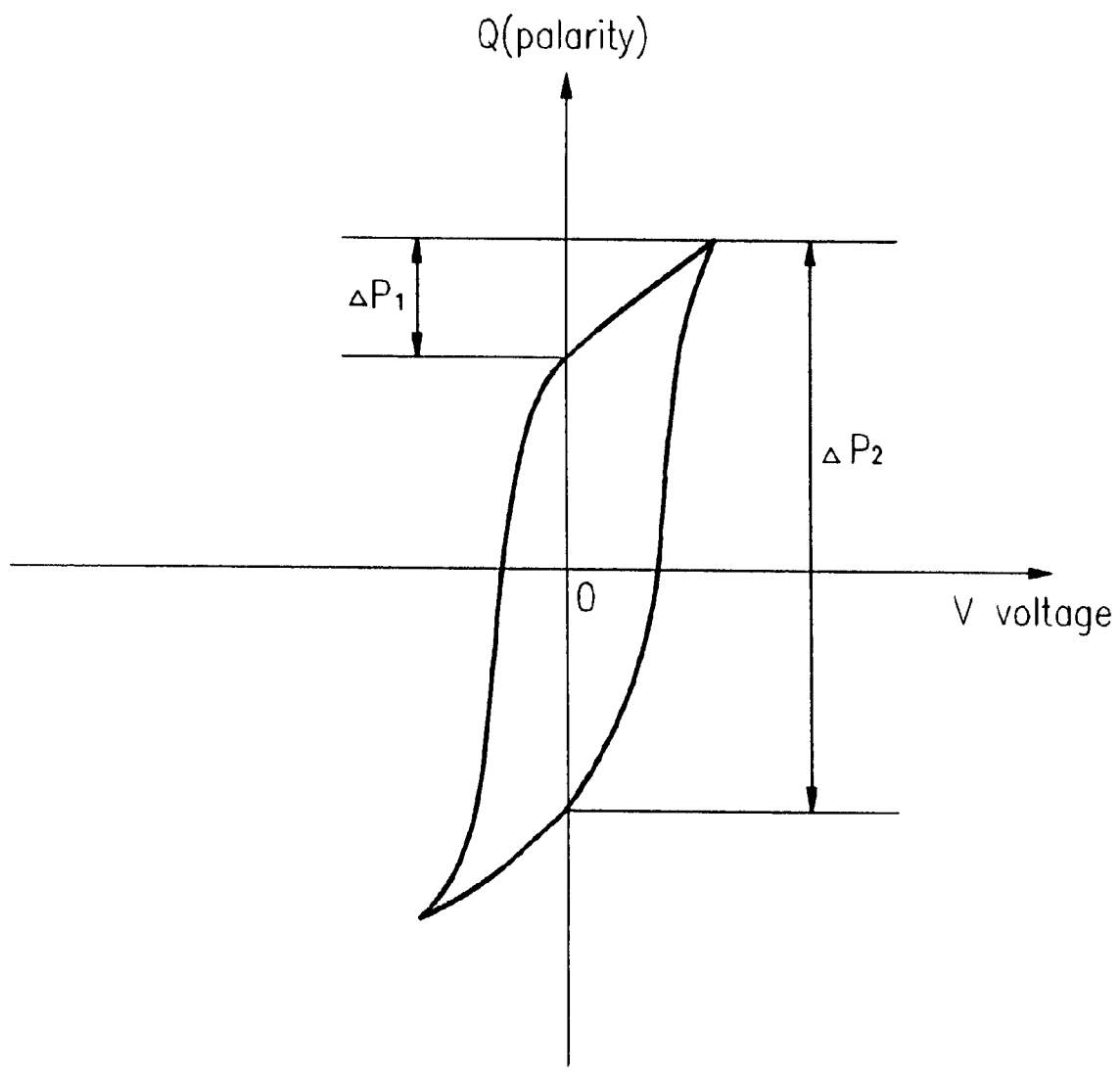
FIG. 3 illustrates a hystereris loop showing voltage vs. polarity.

All the transistors in the switching part 20, the equalizing part 30 and the amplifying part 50 are turned off, and transmission gates 17 and 18 in the second switching part 40 are turned on. Under this condition, a "high" signal is applied to the wordline W/L shown in FIG. 4 to turn on the transistors 2 and 3, and voltages of opposite polarities are applied to the bitline BIT and the bitbarline BITB according to a data intended to write. Then, as explained in association with FIG. 2a and 2b, the specific voltages applied to the bitline BIT and the bitbarline BITB cause the ferroelectric film in the ferroelectric capacitor to have polarities. When the ferroelectric film is assumed to have enough polarities, a "low" signal is applied to the wordline W/L, turning the transistors 2 and 3 off, a data is written on the ferroelectric capacitor.

READ MODE

The explanation will be proceeded with reference to FIGS. 4 to 7. Referring to FIG. 5, the second switching part 40 is turned off, the bitline BIT and the bitbarline BITB are pulled down to a low level, and the signal EQ to the equalizing part 30 is transited to, and held at a "high" level for a time period for equalization. Then, when the "high" pulse of the signal EQ ends, under a condition that a signal SP in FIG. 5 is transited to "high" and a signal SN is transited to "low", the wordline W/L in FIG. 2 is transited to "high" to turn on the transistors 2 and 3, and an external signal PU is transited to "high" to turn on the first switching part 20, so that the bitline and the bitbarline are pulled up to a high level slowly. In this instance, there occurs a voltage difference between opposite terminals of the ferroelectric capacitor 1 according to polarities of the capacitor 1. And, the voltage difference is amplified by amplification of the transistors 4 and 5, and this amplified level is transmitted to the bitline BIT and the bitbarline BITB. When a difference of levels between the bitline BIT and the bitbarline BITB is enough, the external signal SN is transited to "high" and the signal SP is transited to "low", to operate the sense amplifier.

It will be explained with reference to FIG. 6. Though there is no voltage difference between the opposite terminals of the capacitor before a static voltage Vcc is supplied to the bitline BIT and the bitbarline BITB, on the moment the static voltage is supplied to the bitline BIT and the bitbarline BITB, there occurs a minute voltage difference between the opposite terminals A and B of the capacitor 1 according to polarities of the capacitor 1. For example, if A terminal has a positive polarity and the B terminal has a negative polarity, a voltage on A terminal is higher by a minute amount than a voltage on B terminal, which is amplified by amplification of the transistors 4 and 5. Thus, upon transition of the signal SN to "high" and the signal SP to "low" when the voltage difference is enough, the sense amplifier becomes operative. That is, when the transistor 11 and the transistor 16 are turned on, the transistors 12–15 amplify a difference of voltages on the bitline BIT and the bitbarline BITB, signals to be provided to the sense amplifier, and feed back to the bitline BIT and the bitbarline BITB, the sense amplifier(not shown, but connected at the ends of the bitline BIT and the bitbarline BITB) senses it, reading the data stored in the ferroelectric capacitor 1.

The aforementioned nonvolatile ferroelectric memory of the present invention and the circuit for controlling the same have the following advantages.

First, as it is a nonvolatile memory, neither a voltage compensating circuit nor a voltage compensating cycle are required.

Second, since a memory cell access of the general non-driven cell plate line type can be applicable, circuit can be simplified and a fast access can be made.

Third, because non-destructive read mode(not the data write mode after a data read mode) is available, fatigue of the ferroelectric film can be prevented, which improves a reliability of the device.

It will be apparent to those skilled in the art that various modifications and variations can be made in the nonvolatile ferroelectric memory and the circuit for controlling the same of the present invention without departing from the spirit or scope of the invention. Thus, it is intended that the present invention cover the modifications and variations of this invention provided they come within the scope of the appended claims and their equivalents.

What is claimed is:

1. A nonvolatile ferroelectric memory, comprising:
   a ferroelectric memory coupled to a bitline, a bitbarline and a wordline;
   a first switch for supplying a static voltage to the bitline and the bitbarline in response to a first control signal;
   an equalizer for equalizing the bitline and the bitbarline to a ground voltage in response to a second control signal;
   a second switch for applying a data signal to the bitline and the bitbarline in writing in response to a plurality of third control signals; and
   a first amplifier for amplifying signals on the bitline and the bitbarline in response to a plurality of fourth control signals.

2. The nonvolatile ferroelectric memory of claim 1, wherein the first switch includes first and second transistors, each having a control electrode and first and second electrodes, the first electrode of the first and second transistor being coupled to the bitline and bitbarline, respectively, the second electrode of the first and second transistors being coupled for receiving a prescribed potential, and the control electrode of the first and second transistors being commonly coupled for receiving the first control signal.

3. The nonvolatile ferroelectric memory of claim 1, wherein the equalizer includes first, second and third transistors, each having a control electrode and first and second electrodes, the first electrode of the first and second transistors being coupled to the bitline and bitbarline, respectively, the second electrode of the first and second transistors being coupled for receiving a prescribed potential, the first and second electrodes of the third transistor being coupled to the bitline and bitbarline, respectively, and the control electrode of the first, second and third transistors being coupled for receiving the second control signal.

4. The nonvolatile ferroelectric memory of claim 1, wherein the second switch includes first and second transmission gates and an inverter.

5. The nonvolatile ferroelectric memory of claim 4, wherein said inverter is coupled between the first and second transmission gates, which are coupled to said bitline and bitbarline, respectively, said first and second transmission gates being responsive to corresponding third control signals.

6. The nonvolatile ferroelectric memory of claim 1, wherein the first amplifier includes first and second transistors and a feedback output circuit coupled therebetween, and the bitline and bitbarline.

7. The nonvolatile ferroelectric memory of claim 6, wherein each of the first and second transistors includes a control electrode and first and second electrodes, the first electrode of the first and second transistors being coupled to the static and ground voltages, respectively, and the second electrode of the first and second transistors being coupled to the feedback output circuit, and the control electrode of the first and second transistors being coupled for receiving the corresponding one of the fourth control signals.

8. The nonvolatile ferroelectric memory of claim 6, wherein said feedback output circuit comprises third, fourth, fifth and sixth transistors, each having a control electrode and first and second electrodes, the first electrode of the third and fourth transistors being coupled to the first transistor and the first electrode of the fifth and sixth transistors being coupled to the second transistor, the control electrode of the third and fourth transistors being coupled to the second electrode of the fourth and sixth transistors and the bitbarline, and the control electrode of the fourth and sixth transistors being coupled to the second electrode of the third and fifth transistors and the bitline.

9. The nonvolatile ferroelectric memory of claim 1, wherein the ferroelectric memory comprises:
   a ferroelectric capacitor for storing data corresponding to the data signal;
   first and second transistors for switching between opposite terminals of the ferroelectric capacitor and the bitline and bitbarlines, respectively, in response to a driving signal on the wordline; and
   a second amplifier for amplifying voltages from the opposite terminals of the ferroelectric capacitor.

10. The nonvolatile ferroelectric memory of claim 9, wherein said second amplifier comprises third and fourth transistors, each having a control electrode and first and second electrodes, wherein the gate electrode of the third transistor being coupled to the first transistor, a first terminal of the ferroelectric capacitor and the first electrode of the fourth transistor, the first electrode of the third transistor being coupled a second terminal of the ferroelectric capacitor, the second transistor and the gate electrode of the fourth transistor, the second electrode of the third and fourth transistors being coupled for receiving the ground potential.

11. The nonvolatile ferroelectric memory of claim 10, wherein said first, second, third and fourth transistors comprise NMOS transistors.

12. A nonvolatile ferroelectric memory, comprising:

a wordline for applying a driving signal;

a bitline and a bitbarline for applying a data signal;

a ferroelectric capacitor for storage of a data;

a first switching means for switching between opposite terminals of the ferroelectric capacitor and the bitline and the bitbarline respectively in response to a control signal on the wordline;

a first amplifying means for amplifying a difference of voltages on opposite terminals on the capacitor;

a second switching means for applying static voltages to the bitline and the bitbarline respectively in response to external signals;

an equalizing means for equalizing the bitline and the bitbarline to a ground voltage in response to an external signal;

a third switching means for applying a data signal to the bitline and the bitbarline in writing in response to external signals; and a second amplifying means for amplifying signals on the bitline and the bitbarline and feeding back to the bitline and the bitbarline for sensing of the data signal in response to external control signals.

13. A nonvolatile ferroelectric memory, comprising:

a wordline for receiving a driving signal;

first and second bitlines for applying a data signal;

a first switch coupled to the first bitline and the wordline;

a second switch coupled to the second bitline and the wordline;

a ferroelectric memory coupled to said first and second switches;

a first switching circuit coupled to said first and second bitlines for supplying a first voltage in response to a first control signal; and a second switching circuit for applying the data signal to the first and second bitlines.

14. The nonvolatile ferroelectric memory of claim 13, wherein said first and second switches are first and second transistors and said ferroelectric memory comprises:

a capacitor for storing data corresponding to the data signal, said capacitor having first and second opposing terminals and a ferroelectric material therebetween; and an amplifier for amplifying voltages from first and second opposing terminals of the capacitor.

15. The nonvolatile ferroelectric memory of claim 14, wherein said first and second switches are first and second transistors for switching between first and second opposing terminals of the capacitor and the first and second bitlines, respectively.

16. The nonvolatile ferroelectric memory of claim 15, wherein said amplifier comprises third and fourth transistors, each having a control electrode and first and second electrodes, wherein the gate electrode of the third transistor being coupled to the first transistor, the first terminal of the capacitor and the first electrode of the fourth transistor, the first electrode of the third transistor being coupled the second terminal of the capacitor, the second transistor and the gate electrode of the fourth transistor, the second electrode of the third and fourth transistors being coupled for receiving a second voltage.

17. The nonvolatile ferroelectric memory of claim 13, wherein said first switching circuit comprises first and second transistors, each having a control electrode and first and second electrodes, the first electrode of the first and second transistors being coupled to the first and second bitlines, respectively, the second electrode of the first and second transistor being coupled for receiving the first voltage, and the control electrode of the first and second transistors being commonly coupled for receiving the first control signal.

18. The nonvolatile ferroelectric memory of claim 13, wherein said second switching circuit comprises first and second transmission gates with an inverter coupled therebetween and coupled to the first and second bitlines, respectively.

19. The nonvolatile ferroelectric memory of claim 13 further comprising:

an equalizer for equalizing the first and second bitlines to a prescribed potential in response to a second control signal; and an amplifier for amplifying signals on the first and second bitlines.

20. The nonvolatile ferroelectric memory of claim 19, wherein said equalizer includes first, second and third transistors, each having a control electrode and first and second electrodes, the first electrode of the first and second transistors being coupled to the first and second bitlines, respectively, the second electrode of the first and second transistors being coupled for receiving a second voltage, the first and second electrodes of the third transistor being coupled to the first and second bitlines, respectively, and the control electrode of the first, second and third transistors being coupled for receiving the second control signal.

21. The nonvolatile ferroelectric memory of claim 19, wherein said amplifier comprises first and second transistors and a feedback output circuit coupled therebetween and the first and second bitlines.

22. The nonvolatile ferroelectric memory of claim 21, wherein said feedback output circuit comprises third, fourth, fifth and sixth transistors, each having a control electrode and first and second electrodes, the first electrode of the third and fourth transistors being coupled to the first transistor and the first electrode of the fifth and sixth transistors being coupled to the second transistor, the control electrode of the third and fourth transistors being coupled to the second electrode of the fourth and sixth transistors and the second bitline, and the control electrode of the fourth and sixth transistors being coupled to the second electrode of the third and fifth transistors and the first bitline.

* * * * *